(12) United States Patent
Kang et al.

(10) Patent No.: US 10,912,214 B2
(45) Date of Patent: Feb. 2, 2021

(54) FLEXIBLE DISPLAY DEVICE

(71) Applicant: LG ELECTRONICS INC., Seoul (KR)

(72) Inventors: Timothy Kang, Seoul (KR); Hosung Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/534,267

(22) Filed: Aug. 7, 2019

(65) Prior Publication Data

US 2020/0137907 A1    Apr. 30, 2020

Related U.S. Application Data

(60) Provisional application No. 62/750,792, filed on Oct. 25, 2018.

(30) Foreign Application Priority Data

Dec. 5, 2018 (KR) .......................... 10-2018-0155425

(51) Int. Cl.
| | |
|---|---|
| *H02B 1/38* | (2006.01) |
| *H05K 5/02* | (2006.01) |
| *E05D 11/00* | (2006.01) |
| *E05D 3/12* | (2006.01) |
| *H05K 5/00* | (2006.01) |
| *H05K 5/03* | (2006.01) |
| *E05D 11/08* | (2006.01) |

(52) U.S. Cl.
CPC ........... *H05K 5/0226* (2013.01); *E05D 3/122* (2013.01); *E05D 11/0054* (2013.01); *E05D 11/082* (2013.01); *H05K 5/0017* (2013.01); *H05K 5/0217* (2013.01); *H05K 5/03* (2013.01); *E05Y 2900/606* (2013.01)

(58) Field of Classification Search
None
See application file for complete search history.

(56) References Cited

U.S. PATENT DOCUMENTS

| | | | |
|---|---|---|---|
| 9,348,450 B1 * | 5/2016 | Kim ....................... | G06F 3/0412 |
| 9,535,452 B2 * | 1/2017 | Ahn ....................... | H05K 5/0017 |
| 9,905,795 B2 * | 2/2018 | Matsueda ............ | H04M 1/0268 |
| 10,028,395 B2 * | 7/2018 | Chen ................. | G02F 1/133308 |

(Continued)

FOREIGN PATENT DOCUMENTS

| | | |
|---|---|---|
| JP | 2012-150139 A | 8/2012 |
| KR | 10-1847047 B1 | 4/2018 |

*Primary Examiner* — Xanthia C Cunningham
(74) *Attorney, Agent, or Firm* — Birch, Stewart, Kolasch & Birch, LLP

(57) ABSTRACT

A flexible display device including a first body and a second body; a hinge portion connecting the first body and the second body in a relatively rotatable manner; a flexible display unit disposed on one side of the first body and the second body to be folded and unfolded by the relative rotation; a cover member disposed between the first body and the second body; and a lever connected to the hinge portion to rotate in conjunction with the folding and unfolding of the flexible display unit and configured to engage the cover member to move the cover member outwards to cover a space between the first body and the second body formed by folding the flexible display unit.

20 Claims, 12 Drawing Sheets

(56) References Cited

U.S. PATENT DOCUMENTS

| | | | |
|---|---|---|---|
| 10,067,528 B2* | 9/2018 | Lee | G06F 1/1616 |
| 10,244,088 B2* | 3/2019 | Kikuchi | G06F 1/1694 |
| 2012/0243207 A1* | 9/2012 | Wang | G09F 9/301 |
| | | | 362/97.1 |
| 2015/0366089 A1 | 12/2015 | Park et al. | |
| 2016/0378203 A1* | 12/2016 | Kim | G06F 1/1679 |
| | | | 345/156 |
| 2017/0364123 A1 | 12/2017 | Seo et al. | |

* cited by examiner

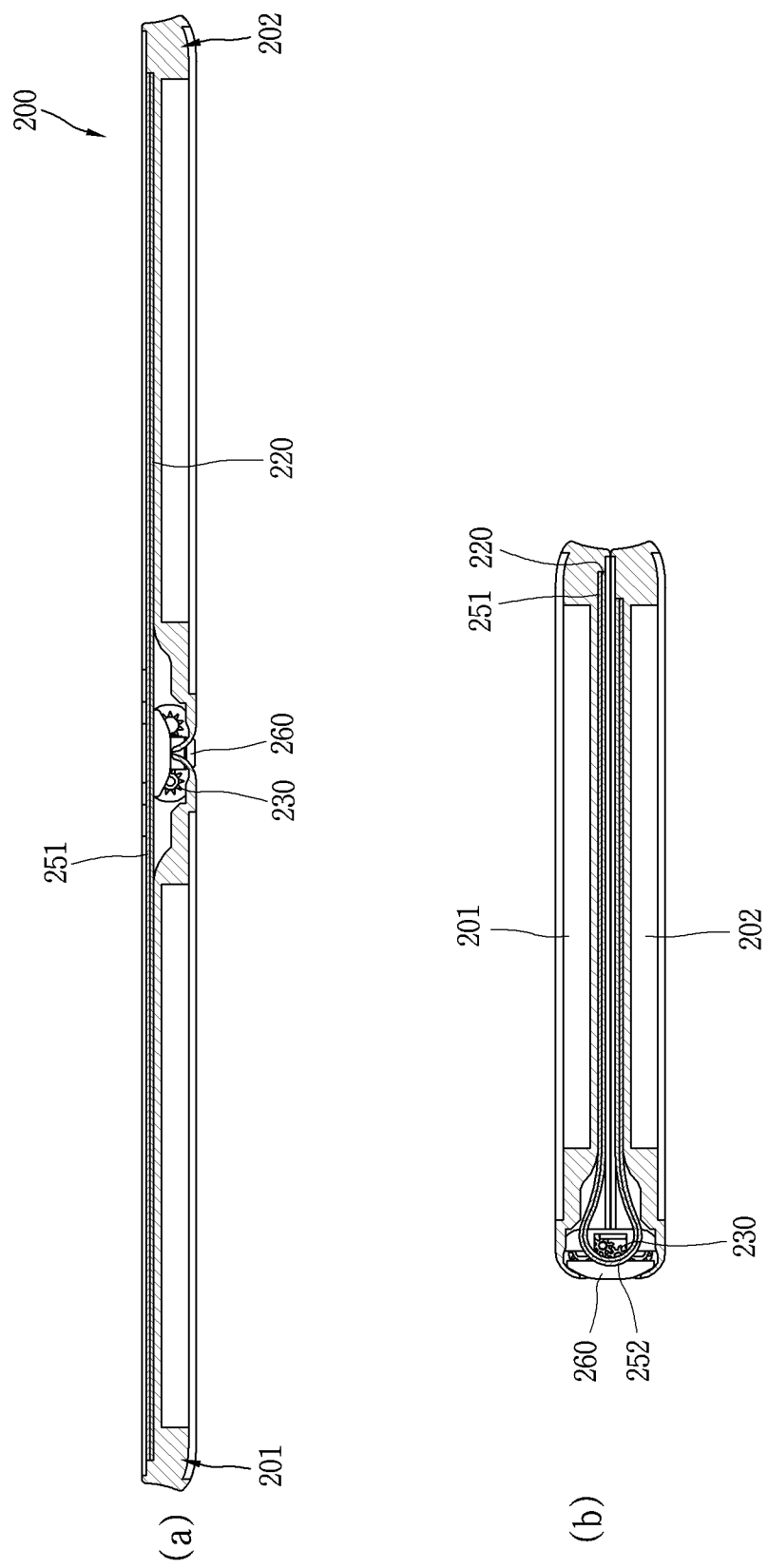

FLEXIBLE DISPLAY DEVICE

CROSS-REFERENCE TO RELATED APPLICATIONS

This Application claims the priority benefit under 35 U.S.C. § 119(e) to U.S. Provisional Application No. 62/750,792 filed on Oct. 25, 2018, and under 35 U.S.C. § 119(a) to Korean Application No. 10-2018-0155425 filed in the Republic of Korea on Dec. 5, 2018, the entire contents of which are incorporated by reference herein.

BACKGROUND OF THE INVENTION

Field of the Invention

The present disclosure relates to a flexible display device having a flexible display that is deformable by an external force.

Discussion of the Related Art

A portable electronic device (hereinafter, mobile terminal) such as a communication terminal, a multimedia device, a portable computer, a game machine, and a photographing apparatus has a display for displaying image information. The mobile terminal may have a folding structure that can be folded to a smaller size for convenience of carrying. In this type of electronic device, two bodies are connected by a folding structure (for example, a hinge portion).

Displays in the related art have a non-foldable structure, and thus a structure in which a display is disposed over two whole bodies that are foldably connected to each other cannot be implemented. Therefore, a substantially large screen cannot be applied to an electronic device with a folding structure.

However, in recent years, as a flexible display capable of bending has been developed, research has been performed to apply a flexible display to a mobile terminal having a folding structure. In this instance, a flexible display may be disposed over two whole bodies across a folding structure, thereby implementing a large screen.

However, when deforming the flexible display into a folding (folded) state and an unfolding (unfolded) state using a hinge portion, in order to implement a function of the hinge portion, there exist a problem that a size of the display is increased, a deformation problem of a bent portion, and a problem that a space between two bodies is exposed to the outside in the folding state.

More specifically, in order to compensate for the characteristics of the display, an electronic device having a folding structure requires various considerations on a hinge operating structure (a length compensating scheme, a concealed structure, an interlocking structure for each element) for controlling a neutral plane of the display or a structure for supporting a rear surface of the display, and an operating scheme thereof. Due to these considerations, the complexity of the overall structure of the hinge portion and the device increases, and thus there is a limitation in implementing the form of an actually operating terminal.

However, in the flexible devices developed up to now, there is no proposed hinge structure capable of solving these various problems. Accordingly, according to the present disclosure, a new mechanism will be applied to the hinge portion and its surrounding structure to solve this problem.

SUMMARY OF THE INVENTION

A first object of the present disclosure is to provide a hinge structure capable of reducing a size of a flexible display device.

A second object of the present disclosure is to provide a new mechanism capable of attaining slimness and covering a space between bodies in a flexible display device.

A third object of the present disclosure is to implement a hybrid function capable of covering a space between bodies at the time of folding while flatly spreading a flexible display at the time of unfolding in the flexible display device.

In order to achieve the foregoing objectives of the present disclosure, a flexible display device may be configured such that a lever connected to a hinge portion and interlocked with the rotation of the body supports at least part of a cover member. In addition, a new mechanism and a hybrid function may be implemented through this.

More specifically, the flexible display device may include a first body and a second body, a hinge portion connecting the first body and the second body in a relatively rotatable manner, a flexible display unit disposed on one side of the first body and the second body to be folded and unfolded by the relative rotation, a cover member disposed between the first body and the second body to cover a space between the first body and the second body formed by the folding of the flexible display unit, and a lever connected to the hinge portion to rotate in conjunction with the folding and unfolding of the flexible display unit so as to support at least part of the cover member.

According to an embodiment of the present disclosure, the cover member may move between a first state supporting the flexible display unit in conjunction with the folding and unfolding of the flexible display unit and a second state being spaced apart from the flexible display unit so as to cover the between space.

One side of the cover member may be supported by at least one of the housings of the first body and the second body and the other side thereof may be supported by the lever so as to move between the first state and the second state.

A protrusion portion may be protruded from the housing to press one side of the cover member in the first state. The protruding portion may include a first portion protruded from ends of the first body and the second body and a second portion extended in a direction inclined with respect to the first portion. At least part of the second portion may be formed in a curved surface so as to press one side of the cover member in the first state, and cover at least part of the cover member in the second state.

For another example, the hinge portion may have a first rotation shaft connected to the first body and a second rotation shaft connected to the second body, and the lever may be coupled to at least one of the first rotation shaft and the second rotation shaft.

The hinge portion may further include a hinge housing in which the first rotation shaft and the second rotation shaft are accommodated, and an insertion hole into which at least part of the cover member is inserted may be formed on one side of the hinge housing. The lever may be accommodated in the hinge housing to support at least part of the cover member. A movement range of the cover member may be restricted by upper and lower ends of the insertion hole.

For still another example, the cover member may include a cover body disposed between the first body and the second body, and an insertion protrusion protruded from an end portion of the cover body and inserted into the insertion hole.

The cover body may be supported by at least one of the housings of the first body and the second body, and the insertion protrusion may be supported by the lever. The lever may include a coupling portion coupled to the first rotation shaft or the second rotation shaft, and a support protrusion protruded from the coupling portion to support the insertion protrusion.

Furthermore, the present disclosure may provide different functions to upper and lower side hinges of a display to attain slimness of the display device. For a specific example, the hinge portion may include a first hinge and a second hinge disposed at both ends of the cover member. In this instance, gear connection for axial interlocking may be applicable to either one of the first hinge and the second hinge, and a stopper structure for free stopping may be applicable to the other one thereof.

For example, the rotation shafts of the first hinge may be gear-engaged to axially interlock the first body and the second body, and a frictional force may be applied to the rotation shafts of the second hinge to fix the first body and the second body at an arbitrary angle. The first hinge may have an intermediate gear disposed between the rotation shafts of the first hinge, and the second hinge may have a friction member that generates a frictional force to the rotation shafts of the second hinge.

Furthermore, the present disclosure discloses a flexible display device, including a first body and a second body, a flexible display unit configured to be folded and unfolded by a relative rotation between the first body and the second body, a cover member formed to cover a space between the first body and the second body, and a first hinge and a second hinge disposed at both ends of the cover member, respectively, wherein the rotation shafts of the first hinge are gear-engaged to axially interlock the first body and the second body, and a frictional force is applied to the rotation shafts of the second hinge to fix the first body and the second body at an arbitrary angle, and a lever supporting at least part of the cover member is coupled to the first hinge and the second hinge, respectively, to move the cover member in conjunction with the folding and unfolding of the flexible display unit.

The effects of the present disclosure obtained through the foregoing solutions are as follows.

First, a hinge portion may transmit a force to a cover member using only a lever with no additional link structure, thereby providing a more compact structure to a display device.

Second, a cover member may apply a physical force to a rear surface of a flexible display at the time of unfolding to always restore the flexible display to a flat state, thereby preventing the occurrence of a phenomenon in which the surface undulates like a wave. Therefore, the reliability of a flexible display device can be improved. Furthermore, a physical force applied at the time of unfolding may be provided by a housing of a display device, thereby allowing the maintenance of a compact structure.

Third, different functions may be provided to upper and lower hinges of a display, thereby providing a display device with a compact structure capable of axial interlocking and free stopping. Moreover, a space in which a lever is coupled to a hinge portion may be secured at upper and lower hinges, respectively, to maintain the hinge portion having a compact size, thereby implementing a display device with a small bezel.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

FIG. 2 is cross-sectional views illustrating a structure of a flexible display device according to an embodiment of the present disclosure.

DETAILED DESCRIPTION OF THE PREFERRED EMBODIMENT

Hereinafter, preferred embodiments of the present disclosure will be described in detail with reference to the accompanying drawings, and the same or similar elements are designated with the same numeral references and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

Although the terms first, second, etc. may be used herein to describe various elements, these elements should not be limited by these terms. These terms are generally only used to distinguish one element from another.

When an element is referred to as being "connected with" another element, the element can be directly connected with the other element or intervening elements may also be present. On the contrary, in case where an element is "directly connected" or "directly linked" to another element, it should be understood that any other element is not existed therebetween. A singular representation may include a plural representation as far as it represents a definitely different meaning from the context.

Hereinafter, preferred embodiments of the present disclosure will be described in detail with reference to the accompanying drawings, and the same or similar elements are designated with the same numeral references and their redundant description will be omitted. Display devices described herein may include cellular phones, smart phones, laptop computers, digital broadcasting terminals, personal digital assistants (PDAs), portable multimedia players (PMPs), navigators, slate PCs, tablet PCs, ultrabooks, wearable devices (for example, smart watches, smart glasses, head mounted displays (HMDs)), and the like.

However, it may be easily understood by those skilled in the art that the configuration according to the exemplary embodiments of present specification can also be applied to stationary terminals such as digital TV, desktop computers, digital signages, and the like, excluding a case of being applicable only to the mobile terminals. Hereinafter, a mobile terminal will be described as an example of a flexible display device for convenience of description in the present specification.

Figure 1A:
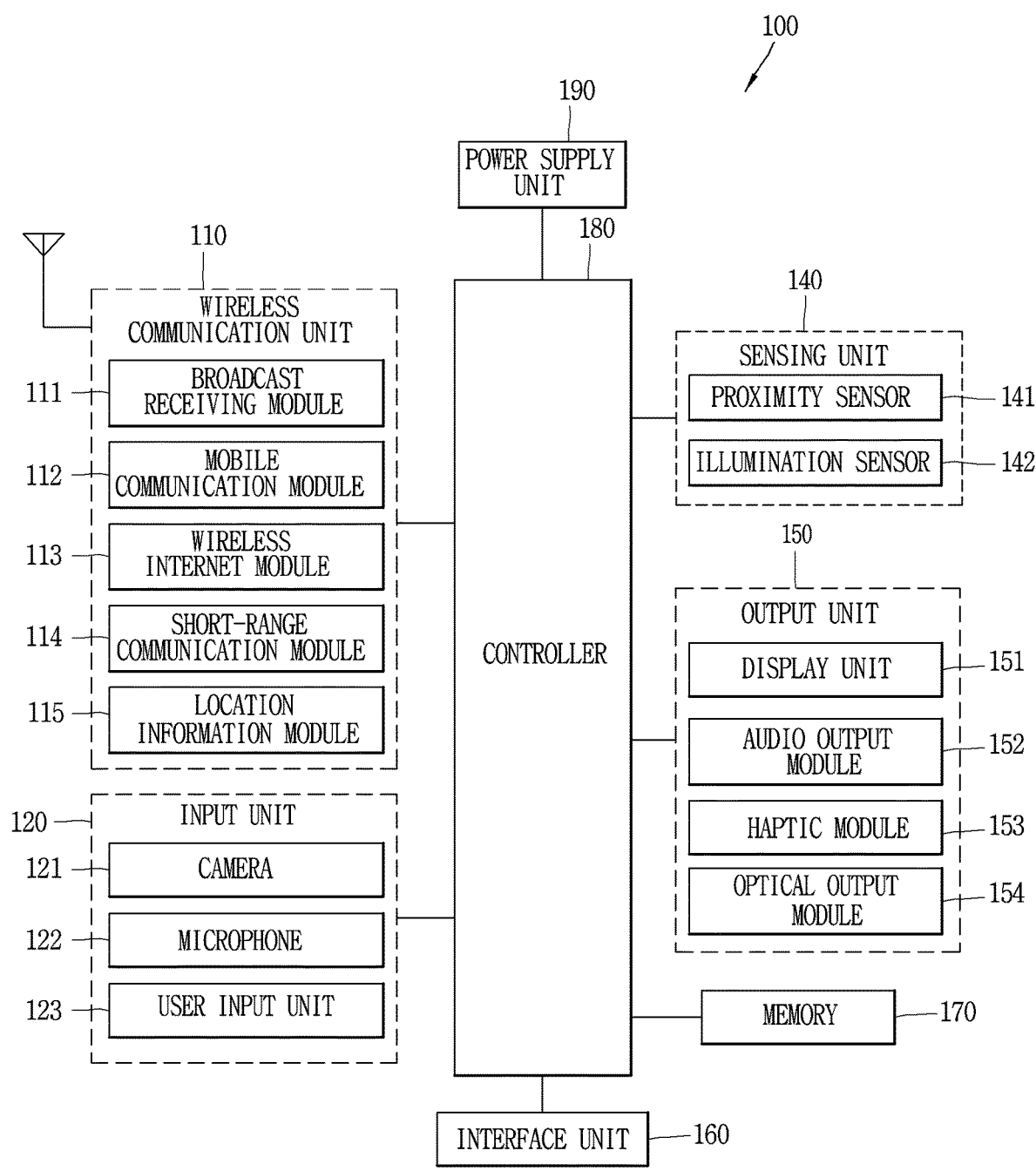
FIG. 1A is a block diagram illustrating explaining a display device associated with the present disclosure.

FIG. 1A is a block diagram illustrating explaining a mobile terminal associated with the present disclosure. The mobile terminal 100 may include components, such as a wireless communication unit 110, an input unit 120, a sensing unit 140, an output unit 150, an interface unit 160, a memory 170, a controller 180, a power supply unit 190 and the like. FIG. 1A illustrates the mobile terminal having various components, but it may be understood that implementing all of the illustrated components is not a requirement. Greater or fewer components may alternatively be implemented.

In more detail, the wireless communication unit 110 of those components may typically include one or more modules which permit wireless communications between the mobile terminal 100 and a wireless communication system, between the mobile terminal 100 and another mobile terminal 100, or between the mobile terminal 100 and an external server. In addition, the wireless communication unit 110 may include one or more modules for connecting the mobile terminal 100 to one or more networks.

The wireless communication unit 110 may include at least one of a broadcast receiving module 111, a mobile communication module 112, a wireless Internet module 113, a short-range communication module 114, a location information module 115 and the like. The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). The mobile terminal 100 may be configured to utilize information obtained from sensing unit 140, and in particular, information obtained from one or more sensors of the sensing unit 140, and combinations thereof.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 may serve as an interface with various types of external devices connected with the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). Further, the application programs may be stored in the memory 170, installed in the mobile terminal 100, and executed by the controller 180 to perform an operation (or a function) of the mobile terminal 100.

The controller 180 can typically control an overall operation of the mobile terminal 100 in addition to the operations associated with the application programs. The controller 180 can provide or process information or functions appropriate for a user by processing signals, data, information and the like, which are input or output by the aforementioned components, or activating the application programs stored in the memory 170.

Furthermore, the controller 180 can control at least part of the components illustrated in FIG. 1A, in order to drive the application programs stored in the memory 170. In addition, the controller 180 can drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various exemplary embodiments described herein. Furthermore, the operation and control or the control method of the mobile terminal may be implemented in the mobile terminal in such a manner of activating at least one application program stored in the memory 170.

Hereinafter, each aforementioned component will be described in more detail with reference to FIG. 1A, prior to explaining various exemplary embodiments implemented by the mobile terminal 100 having the configuration. First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the portable electronic device 100 to simultaneously receive at least two broadcast channels or switch the broadcast channels.

The broadcast management server may mean a server that generates and transmits a broadcast signal and/or broadcast associated information or a server that receives a previously generated broadcast signal and/or broadcast associated information and transmits to the mobile terminal 100. The broadcast signal may be implemented as a TV broadcast signal, a radio broadcast signal, and a data broadcast signal, among others. The broadcast signal may further include a data broadcast signal combined with a TV or radio broadcast signal.

The broadcast signal may be encoded according to at least one of technical standards (or broadcasting methods, e.g., ISO, IEC, DVB, ATSC, etc.) for transmission and reception of digital broadcast signals. The broadcast receiving module 111 may receive the digital broadcast signals using a method appropriate for a technical specification defined in the technical standards.

The broadcast associated information may mean information regarding a broadcast channel, a broadcast program, a broadcast service provider, and the like. The broadcast associated information may also be provided through a mobile communication network. The broadcast associated information may be provided via a mobile communication network, and received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a memory 160.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.). The wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks. The short-range communication module 114 denotes a module for short-range communications.

Here, the another mobile terminal 100 may be a wearable device, for example, a smart watch, smart glasses or a head mounted display (HMD), which can exchange data with the mobile terminal 100 (or to link data with the mobile terminal 100). The short-range communication module 114 may sense (recognize) a wearable device, which can communicate with the mobile terminal), near the mobile terminal 100. In addition, when the sensed wearable device is a device which is authenticated to communicate with the mobile terminal 100 according to the present disclosure, the controller 180 can transmit at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a WiFi module, or both. For example, when the mobile terminal uses the GPS module, a position of the mobile terminal may be acquired using a signal sent from a GPS satellite. As another example, when the mobile terminal uses the Wi-Fi module, a position of the mobile terminal may be acquired based on information associated with a wireless access point (AP) which transmits or receives a wireless signal to or from the Wi-Fi module. According to the need, the location information module 115 may perform any function of the other modules of the wireless communication unit 110 to obtain data on the location of the mobile terminal. As a module used to acquire the location (or current location) of the mobile terminal, the location information module 115 may not be necessarily limited to a module for directly calculating or acquiring the location of the mobile terminal.

Next, the input unit 120 may be configured to provide an audio or video signal (or information) input to the mobile terminal or information input by a user to the mobile terminal. For the input of the audio information, the mobile terminal 100 may include one or a plurality of cameras 121. The camera 121 processes a image frame, such as still picture or video, acquired by an image sensor in a video phone call or image capturing mode. The processed image frames may be displayed on the display unit 151. Further, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). Further, the microphone 122 may include assorted noise removing algorithms to remove noise generated in the course of receiving the external audio signal.

The user input unit 123 may receive information input by a user. When information is input through the user input unit 123, the controller 180 can control an operation of the mobile terminal 100 to correspond to the input information. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. Further, the virtual key or the visual key may be displayed on the touch screen in various shapes, for example, graphic, text, icon, video, or a combination thereof.

Further, the sensing unit 140 may sense at least one of internal information of the mobile terminal, surrounding environment information of the mobile terminal and user information, and generate a sensing signal corresponding to it. The controller 180 can control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this instance, the touch screen (touch sensor) may also be categorized as a proximity sensor.

Further, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). Further, the controller 180 can process data (or information) corresponding to the proximity touches and the proximity touch patterns sensed by the proximity sensor 141, and output visual information corresponding to the process data on the touch screen. In addition, the controller 180 can control the mobile terminal 100 to execute different operations or process different data (or information) according to whether a touch with respect to the same point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. Also, the touch sensor may be configured to sense not only a touched position and a touched area, but also touch pressure. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 can sense which region of the display unit 151 has been touched. Here, the touch controller may be a component separate from the controller 180 or the controller 180 itself.

Further, the controller 180 can execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swipe touch, a hovering touch, and the like.

An ultrasonic sensor may be configured to recognize position information relating to a sensing object by using ultrasonic waves. On the other hands, the controller 180 can calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

Further, the camera 121 constructing the input unit 120 may be a type of camera sensor. The camera sensor may include at least one of a photo sensor (or image sensor) and a laser sensor. Implementing the camera 121 with a laser sensor may allow detection of a touch of a physical object with respect to a 3D stereoscopic image. The photo sensor may be laminated on the display device. The photo sensor may be configured to scan a movement of the sensing object in proximity to the touch screen. In more detail, the photo sensor may include photo diodes and transistors at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

Furthermore, the display unit 151 may also be implemented as a stereoscopic display unit for displaying stereoscopic images. The stereoscopic display unit may employ a stereoscopic display scheme such as stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. Also, the audio output module 152 may also provide audible output signals associated with a particular function (e.g., a call signal reception sound, a message reception sound, etc.) performed by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. The intensity, pattern and the like of vibration generated by the haptic module 153 may be controlled by a user's selection or the settings of the controller 180. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. Two or more haptic modules 153 may be provided according to the particular configuration of the mobile terminal 100.

An optical output module 154 may output a signal for indicating an event generation using light of a light source. Examples of events generated in the mobile terminal 100 may include a message reception, a call signal reception, a missed call, an alarm, a schedule notice, an email reception, an information reception through an application, and the like. A signal output by the optical output module 154 may be implemented so the mobile terminal emits monochromatic light or light with a plurality of colors. The signal output may be ended as the mobile terminal senses a user's event checking.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

Further, the identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identification device") may take the form of a smart card. Accordingly, the identifying device may be connected with the electronic device 100 via the interface unit 160.

Furthermore, when the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Such various command signals or power input from the cradle may operate as signals for recognizing that the mobile terminal 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 can typically control the general operations of the mobile terminal 100. For example, the controller 180 can set or release a locked state for restricting a user from inputting a control command with respect to applications when a state of the mobile terminal meets a preset condition.

Furthermore, the controller 180 can also perform controlling and processing associated with voice calls, data communications, video calls, and the like, or perform pattern recognition processing to recognize a handwriting input or a picture drawing input performed on the touch screen as characters or images, respectively. In addition, the controller 180 can control one or combination of those components in order to implement various exemplary embodiment disclosed herein on the mobile terminal 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance. Various embodiments described herein may be implemented in a computer-readable or its similar medium using, for example, software, hardware, or any combination thereof.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display. Furthermore, the display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

The display unit 151 may include a touch sensor which senses a touch onto the display unit so as to receive a control command in a touching manner. When a touch is input to the display unit 151, the touch sensor may be configured to sense this touch and the controller 180 can generate a control command corresponding to the touch. The content which is input in the touching manner may be a text or numerical value, or a menu item which can be indicated or designated in various modes.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Otherwise, the antenna may be formed in a film type and adhered to an inner surface of a housing, and a case containing a conductive material may be configured to function as an antenna.

A power supply unit 190 (refer to FIG. 1A) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Also, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display unit 151 to extend the function of the mobile terminal 100. Another example of the accessory may be a touch pen for assisting or extending a touch input onto a touch screen.

Figure 1B:
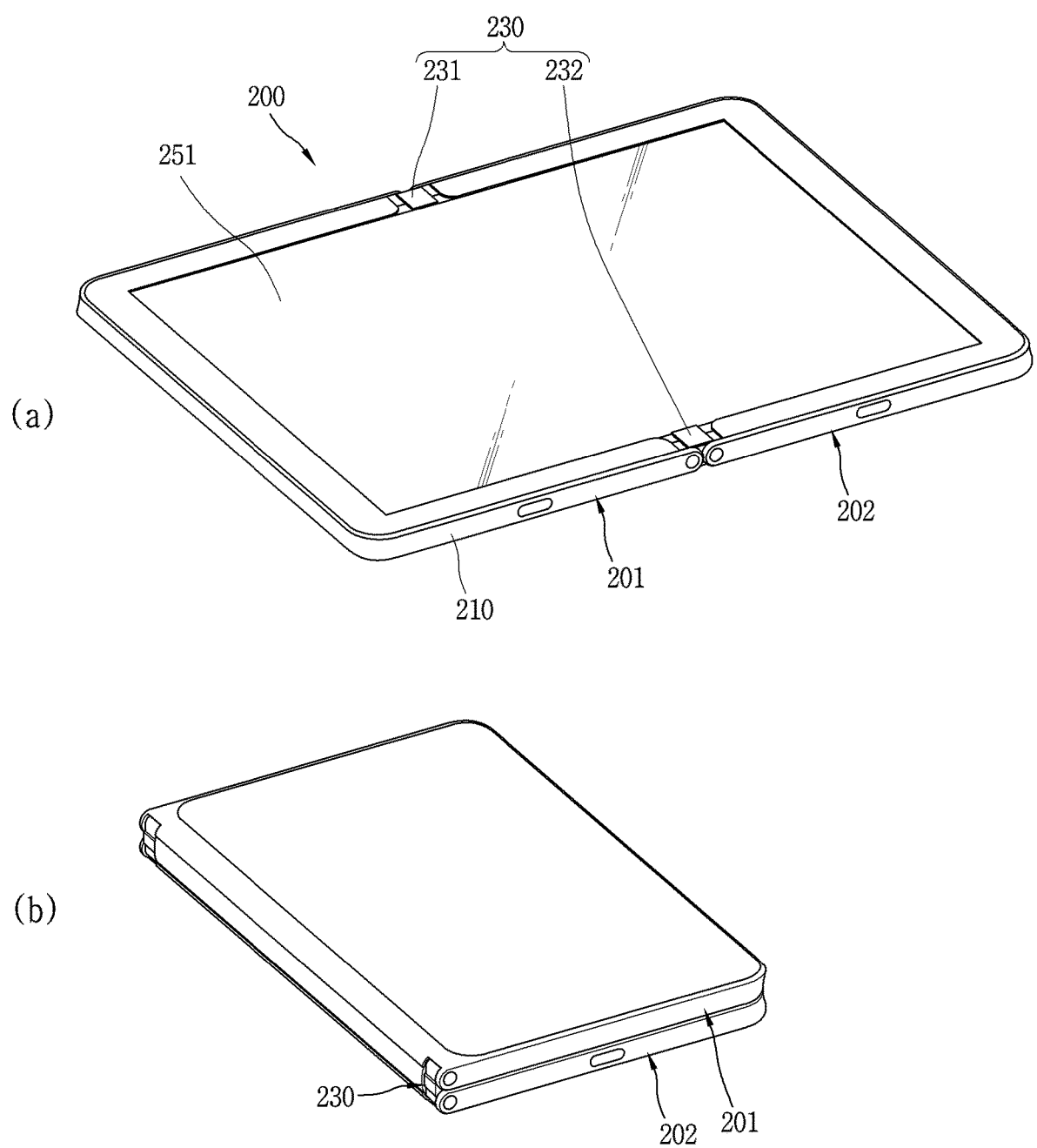
FIG. 1B is a conceptual view illustrating a flexible display device having a flexible display.

FIG. 1B is a conceptual view illustrating a mobile terminal having a flexible display as a flexible display device. A mobile terminal 200 according to the present disclosure includes a flexible display unit 251 that is deformable by an external force.

The deformation may be at least one of curving, bending, folding, twisting and rolling of a display module. The deformable display module may be referred to as a "flexible display." Here, the flexible display unit 151 may include both a general flexible display and an e-paper.

The general flexible display denotes a light, non-fragile display, which still exhibits characteristics of the conventional flat panel display and is fabricated on a flexible substrate which can be curved, bent, folded, twisted or rolled.

Furthermore, the e-paper is a display technology employing the characteristic of a general ink, and is different from the conventional flat panel display in view of using reflected light. The e-paper may change information by using a twist ball or an electrophoresis using a capsule.

When in a configuration in which the flexible display unit 251 is not deformed (for example, in a configuration with an infinite radius of curvature and, hereinafter, referred to as a first configuration, refer to (b) in FIG. 1B), a display region of the flexible display unit 251 becomes a flat surface. In a configuration in which the display unit is deformed from the first configuration by an external force (for example, a configuration with a finite radius of curvature, hereinafter, referred to as a second configuration, refer to (a) in FIG. 1B), the display region may become a curved surface.

As illustrated in the drawings, information displayed in the second configuration may be visual information output on the curved surface. The visual information may be realized so a light emission of each unit pixel (sub-pixel) arranged in a matrix configuration is controlled independently. The unit pixel denotes an elementary unit for representing one color.

The flexible display unit 251 may be placed in a curved state (for example, a state of being curved from up to down or from right to left), other than a flat state, in the first configuration. In this instance, when an external force is applied to the flexible display unit 251, the flexible display unit 251 may be deformed back into a flat state (or less curved state) or into a more curved state.

Further, the flexible display unit 151 may implement a flexible touch screen using a touch sensor in combination with a touch sensor. When a touch is input onto the flexible touch screen, the controller 180 (see FIG. 1A) may execute a control corresponding to the touch input. The flexible touch screen may be configured to sense a touch input even in the second configuration as well as in the first configuration.

Further, the mobile terminal 200 according to the modified example may include a deformation sensor which senses the deformation of the flexible display unit 251. The deformation sensor may be included in the sensing unit 140 (see FIG. 1A).

The deformation sensor may be provided in the flexible display unit 251 or bodies 201, 202 to sense information related to the deformation of the flexible display unit 251. Here, the information related to the deformation of the flexible display unit 251 may be a deformed direction, a deformed degree, a deformed position, a deformed time, an acceleration that the deformed flexible display unit 251 is restored, and the like. In addition to those, such information may be various information which is sensible in response to curving of the flexible display unit 251.

Furthermore, the controller 180 (refer to FIG. 1A) may change information displayed on the flexible display unit 251 or generate a control signal for controlling a function of the mobile terminal 200, based on the information related to the deformation of the flexible display unit 251 sensed by the deformation sensor.

The configuration deformation of the display unit 251 may not be necessarily limited to an external force. For example, when the flexible display unit 251 is in a first configuration, it may be deformed to a second configuration by a command of a user or application.

The mobile terminal 200 according to an embodiment of the present disclosure may include a housing 210 configured to be foldable and unfoldable. The housing 210 may be a case (e.g., a frame, a cover, or the like) that forms an appearance of the mobile terminal. The housing 210 has a plurality of cases, and various electronic parts are arranged in an inner space formed by their coupling.

According to the illustration, the housing 210 may be provided in first and second bodies 201, 202, respectively, which are rotatably connected to each other. The flexible display unit 251 is coupled to one surface of the housing 210, and formed to be deformable.

The first body 201 supports one region of the flexible display unit 251 and the second body 202 supports the other region (remaining region) of the flexible display unit 251. A plurality of electronic parts for driving the mobile terminal 200 are mounted on at least one region of the first and second bodies 201, 202.

The first and second bodies 201, 202 rotate relative to each other with an angle while being connected to each other, and through this, the flexible display unit 251 is bent, and thus the flexible display unit 251 becomes a folding state (folded state, second state) in which at least one region thereof is folded in an overlapping manner.

A drawing (a) of FIG. 1B is a conceptual view illustrating unfolding (an unfolded state, a first state) in which the flexible display unit 251 is in an unfolded state, and a drawing (b) of FIG. 1B is a conceptual view illustrating folding (a second state) in which the flexible display unit 251 is in a folded state.

Although only the first and second states are illustrated in the drawings, there exists a state in which an angle formed by one region of the flexible display unit 251 and the remaining region thereof is varied while being deformed from the first state to the second state.

In the second state, the first and second bodies 201, 202 are overlapped with each other, and a space between the one region and the other region of the flexible display unit 251 is bent while forming a curved surface. In this instance, a portion forming the curved surface may be a bent portion 252 (refer to FIG. 2(B)). In other words, the flexible display unit 251 may be formed with the bent portion 252 configured to be bent by the folding of the housing 210.

Further, the first and second bodies 201, 202 may be rotatably connected to each other by a hinge portion 230. In other words, the hinge portion 230 connects the first and second bodies 201, 202 in a relatively rotatable manner and is disposed between the first and second bodies 201, 202. The flexible display unit 251 is disposed on one surface of the first and second bodies 201, 202, and folded and unfolded by the relative rotation.

In this instance, there is a limit in a bending radius of the flexible display in a foldable mobile terminal. Therefore, it is necessary to consider a difference between a length of the bent portion and a length of the plane during the folding and unfolding operation. In order to compensate for such a length change, the flexible display is disposed between upper and lower hinges in this example. Hereinafter, the flexible display device in this example will be described in detail with reference to the drawings.

Figure 3:
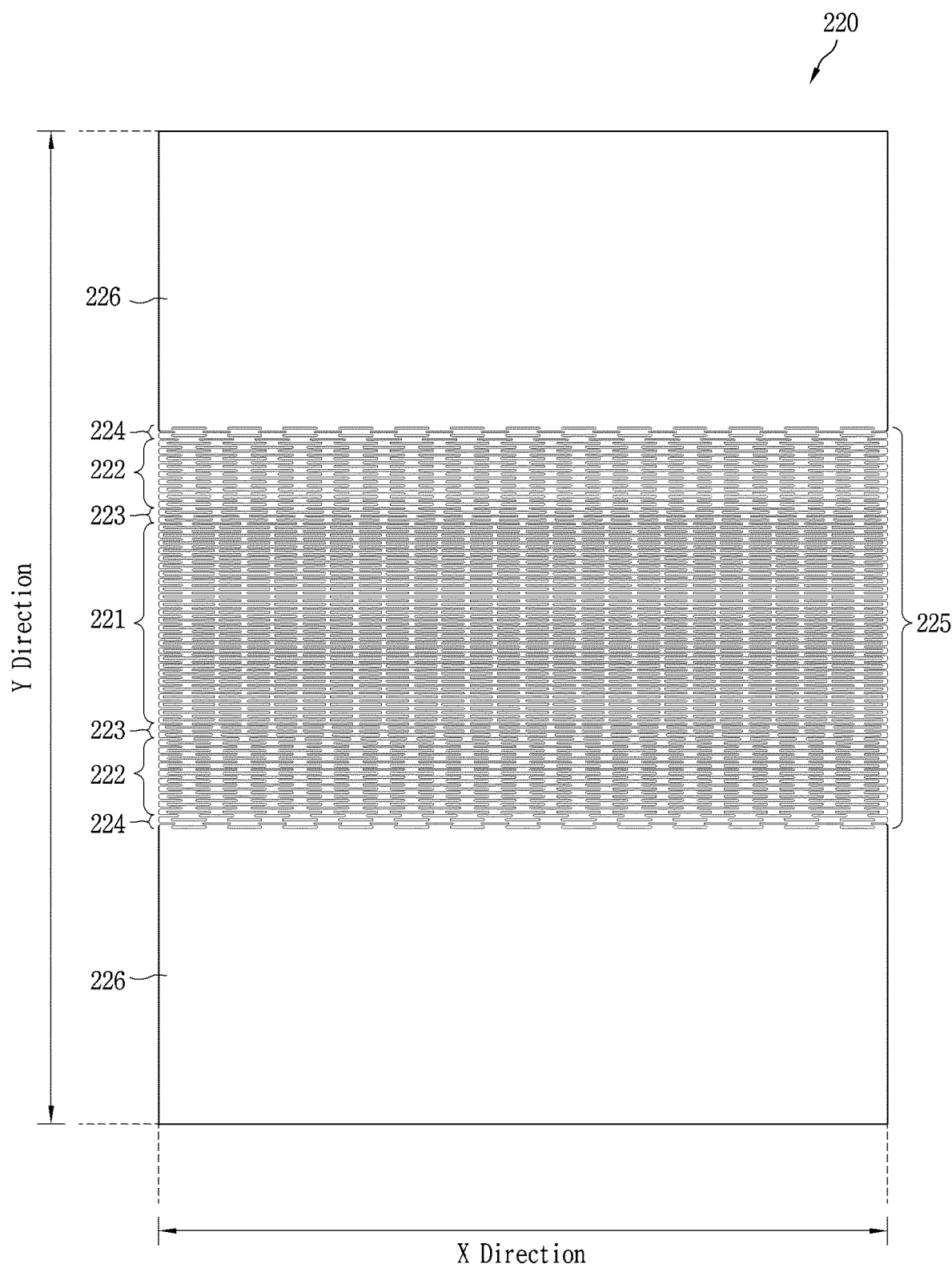
FIG. 3 is an enlarged view showing a flexible frame in FIG. 2(a).

FIGS. 2(a) and 2(b) are cross-sectional views of FIG. 1B illustrating a structure of a flexible display device according to an embodiment of the present disclosure, and FIG. 3 is an enlarged view showing a flexible frame in FIG. 2(a).

As illustrated in the drawings, FIG. 2(a) shows a first state in which the first body 201 and the second body 202 are disposed in parallel, and FIG. 2(b) shows a second state in which the second body 202 is folded over the first body 201. The mobile terminal 200 is configured to freely modify its form from a first state to a second state, or from a second state to a first state. In order to implement this, the first body 201 and the second body 202 may be respectively connected to the hinge portion 230, and configured to be rotatable with respect to the hinge portion 230.

Referring to FIG. 2(a), the flexible display unit 251 is disposed on one surface of the first body 201 and on one surface of the second body 202. In other words, the flexible display unit 251 is disposed over the first body 201 and the second body 202, thereby implementing a large screen.

In this instance, a flexible frame 220 may be disposed on a rear surface of the flexible display unit 251. The flexible frame 220 may have the same or smaller size than the flexible display unit 251 in the X direction. Accordingly, a first hinge 230a and a second hinge 230b of the hinge portion 230 (refer to FIG. 1B) be disposed on both sides of the flexible display unit 251 and the flexible frame 220. However, the present disclosure is not limited thereto, and the flexible frame 220 may be slightly larger than the flexible display unit 251 in the X direction.

Referring to FIG. 3, the flexible frame 220 has a flexible region 225 that is bendable at least at a maximum curvature. The flexible region 225 may include flexible portions 221, 222, 223, 224 that are bendable at different maximum curvatures. The flexible portions 221, 222, 223, 224 may be sequentially disposed along one direction (Y direction in the drawing) of the flexible frame 220, so that the flexible frame 220 can be bent with respect to one direction. In the following description, the X direction corresponds to a widthwise direction of the flexible frame 220, and the Y direction corresponds to a lengthwise direction of the flexible frame 220.

In this example, the flexible region 225 includes a first flexible portion 221 that is bendable up to a state having a maximum first curvature and a second flexible portion 222 that is bendable up to a state having a maximum second curvature. As shown in the drawing, two second flexible portions 222 may be provided, and disposed on both sides of the first flexible portion 221 in the Y direction.

First holes are repeatedly formed on the first flexible portion 221 to implement the bending of the first flexible portion 221. In other words, flexibility may be generated on the first flexible portion 221 due to the first holes, and the first flexible portion 221 may be bent up to a state having the maximum first curvature. The first holes are repeatedly formed along the X and Y directions intersecting each other, respectively. In addition, the first holes are extended in an elongated manner in the X direction.

Similarly, second holes are repeatedly formed on the second flexible portion 222 to implement the bending of the second flexible portion 222. In other words, flexibility may be generated on the second flexible portion 222 due to the second holes, and the second flexible portion 222 may be bent up to a state having the maximum second curvature. Here, the second curvature has a curvature different from the first curvature.

The second holes are formed parallel to the first holes so that the second flexible portion 222 can be bent with respect to the Y direction together with the first flexible portion 221. The second holes are repeatedly formed along the X and Y directions intersecting each other, respectively. Further, the second holes are extended in an elongated manner in the X direction.

In this example, the first curvature may be greater than the second curvature. In other words, the first flexible portion 221 is configured to be more bendable than the second flexible portion 222. In this way, a total area occupied by the first holes per unit area in the first flexible portion 221 is greater than a total area occupied by the second flexible portions per unit area in the second flexible portion 222 so that the first flexible portion 221 is more bendable than the second flexible portion 222.

Therefore, while the first and second flexible portions 221, 222 are bent at the first and second curvatures, respectively, a repulsive force acting on the first flexible portion 221 may be greater than that acting on the second flexible portion 222.

In addition, a rigid portion 226 is disposed on one side of each second flexible portion 222 in the Y direction. The rigid portion 226, as a portion that is hardly bent by an external force, may be formed in a plane. Further, the rigid portion 226 is not formed with holes intended to implement bending.

Thus, the rigid portion 226 and the first flexible portion 221 are disposed on both sides of the second flexible portion 222 in the Y direction. When the first and second flexible portions 221, 222 are bent to the maximum, the rigid portions 226 are arranged to face each other.

As described above, the second flexible portion 222 is disposed on both sides of the first flexible portion 221, respectively, in the Y direction, and the rigid portion 226 is provided on one side of each second flexible portion 222 in the Y direction.

A connecting portion 223 for smoothly connecting the first flexible portion 221 and the second flexible portion 222 is formed between the first flexible portion 111 and the second flexible portion 112. Similarly, a boundary portion 224 for smoothly connecting the first flexible portion 222 and the second flexible portion 226 is formed between them.

In other words, the rigid portion 226, the boundary portion 224, the second flexible portion 222, the connecting portion 223, the first flexible portion 221, the connecting portion 223, the second flexible portion 222, the boundary portion 224, and the rigid portion 226 may be sequentially arranged on the flexible frame 220.

The connecting portion 223 is configured to be less bendable than the first flexible portion 221 and more bendable than the second flexible portion 222. Furthermore, the boundary portion 224 may be configured to be less bendable than second flexible portion 222.

Referring to FIG. 2(a), the first flexible portion 221 of the flexible frame 220 is formed at an intermediate portion of the flexible frame 220 to support the bent portion 252 of the flexible display unit 251. The rigid portion 226 is disposed to cover the first body 201 and the second body 202 to support the flexible display unit 251 in a flat state on both sides of the bent portion 252.

Referring to FIG. 2(b), when the second body 202 is folded over the first body 201, the flexible display unit 251 is bent by an external force. In addition, the first flexible portion 221 is bent at a first curvature, the second flexible portion 222 is bent at a second curvature, and the rigid portions 226 are arranged to face each other. In this instance, since the hinge portions 230 are disposed on both sides of the flexible frame 220, a bent sectional shape of the first flexible portion 221 may be overlapped with a rotation shaft of the hinge portion 230. From a different point of view, the bent sectional shape of the bent portion 252 of the flexible display unit 251 may be overlapped with the rotation shaft of the hinge portion 230. Although a positional relationship between the flexible frame 220, the flexible display unit 251, and the hinge portion 230 has been described above, the present disclosure is not limited thereto, and may also have a configuration without having the flexible frame 220.

Further, referring to FIGS. 2(*a*) and 2(*b*) along with FIG. 1B, the first body 201 and the second body 202 rotate about the hinge portion 230, and thus, end portions of the first body 201 and the second body 202 rotate along an outer edge of the hinge portion 230 between the first state and the second state. In this instance, in the second state, a between space is formed between end portions of the first body 201 and the second body 202. More specifically, an empty space is formed between an end portion of the first body 201, an end portion of the second body 202, and the first hinge 230*a* and the second hinge 230*b* of the hinge portion 230 (see FIG. 5), and the flexible display device 200 may have the cover member 260 capable of covering the space.

In the present disclosure, the cover member 260 is implemented as a shutter structure, thereby providing a new mechanism capable of attaining slimness as well as covering a space between bodies in a flexible display device. Hereinafter, such a mechanism will be described in more detail with reference to FIG. 4.

Figure 4:
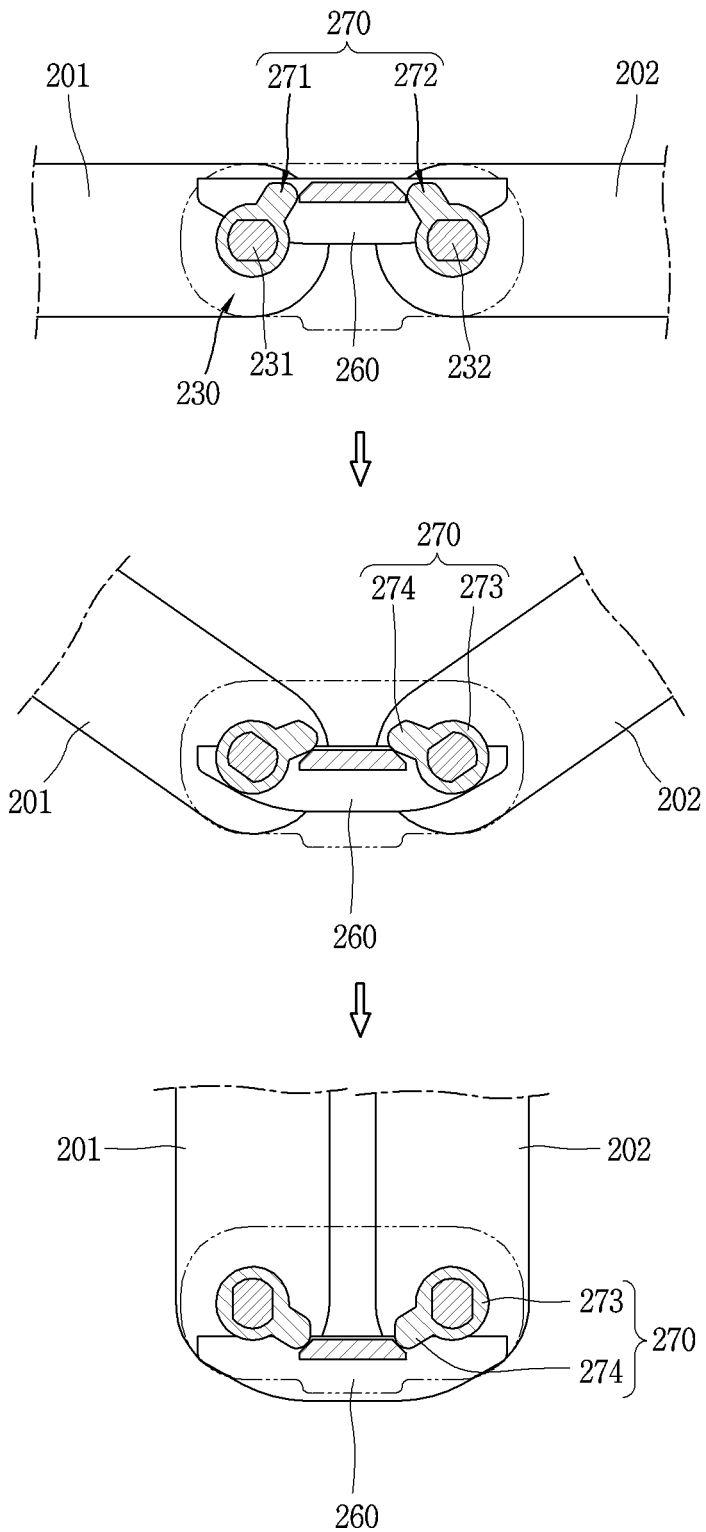
FIG. 4 is an operation diagram illustrating explaining a basic concept of a shutter structure according to an embodiment of the present disclosure.

FIG. 4 is an operation diagram illustrating explaining a basic concept of a shutter structure according to an embodiment of the present disclosure. The cover member 260 is disposed between the body 201 and the second body 202 to cover a space between the first body 201 and the second body 202 formed by the folding of the flexible display unit 251 (see FIGS. 2(*a*) and 2(*b*)). The cover member 260 is formed in an elongated manner along edges of the end portions of the first body 201 and the second body 202, and both side edges (long edge) of the cover member 260 face the end portions of the first body 201 and the second body 202, respectively. Furthermore, the hinge portion 230 is disposed adjacent to both ends (short edges) of the cover member 260.

Referring to the present drawings, the cover member 260 is disposed adjacent to the flexible display unit 251 in the first state, and then pressed by a lever 270 to slidably move to cover a space between the first body 201 and the second body 202 in the second state. For example, the cover member 260 moves between the second state being spaced apart from the flexible display unit 251 and the first state supporting the flexible display unit 251 to cover the between space in conjunction with the folding and unfolding of the flexible display unit 251. However, when the foregoing flexible frame 220 (refer to FIGS. 2(*a*) and 3) is disposed on a rear surface of the flexible display unit 251, the cover member 260 may support the flexible frame 220 in the first state.

At this time, the lever 270 is connected to the hinge portion 230 to rotate in conjunction with the folding and unfolding of the flexible display unit 251 so as to support at least part of the cover member 260. For example, the hinge portion 230 includes a first rotation shaft 231 connected to the first body 201 and a second rotation shaft 232 connected to the second body, and the lever 270 may be coupled to at least one of the first rotation shaft 231 and the second rotation shaft 232.

In this example, a first lever 271 and a second lever 272 are coupled to the first rotation shaft 231 and the second rotation shaft 232, respectively, and the first lever 271 and the second lever 272 rotate together with the first body 201 and the second body 202. According to the illustration, the lever 270 may include a coupling portion 273 coupled to the first rotation shaft 231 or the second rotation shaft 232 and a support protrusion 274 protruded from the coupling portion 273 to support at least part of the cover member 260.

The support protrusion 274 is formed to engage with the cover member 260 in a thickness direction of the cover member 260 in the first state, and thus applies a force to the cover member 260 when the coupling portion 273 rotates. The cover member 260 moves to a position where the space between the bodies 201, 202 is covered by the force.

As described above, according to the present disclosure, the hinge portion 230 may transmit a force to the cover member 260 with only the lever 270 without an additional link structure, thereby providing a more compact structure to the display device. Meanwhile, according to the present disclosure, upper and lower hinges of the display are provided with different functions, providing a display device with a compact structure capable of axial interlocking and free stopping. Hereinafter, the structure of the hinge portion 230 will be described in more detail with reference to FIGS. 5 through 9.

Figure 5:
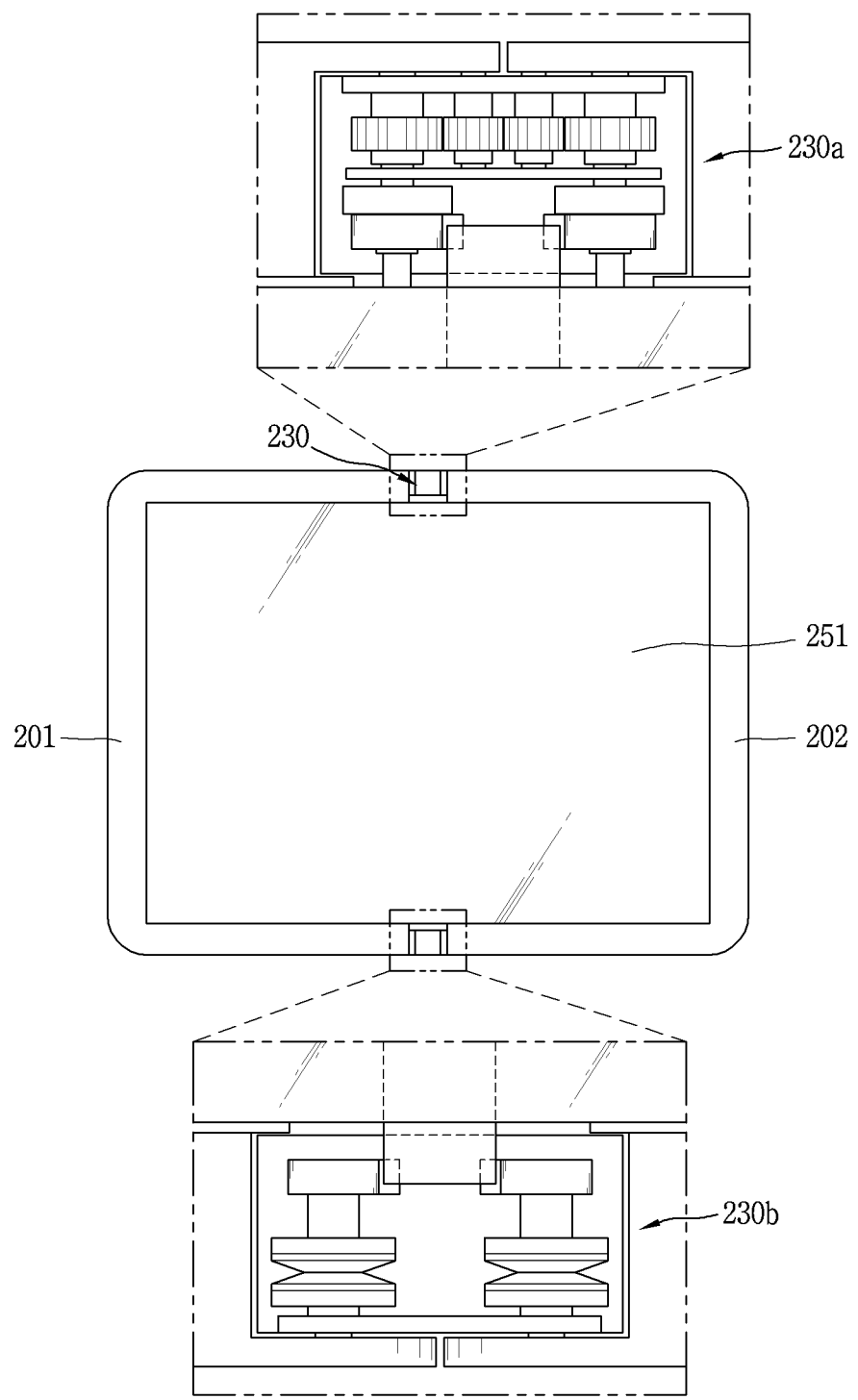
FIG. 5 is a conceptual view showing a basic structure of upper and lower hinge portions according to another embodiment of the present disclosure.
Figure 6:
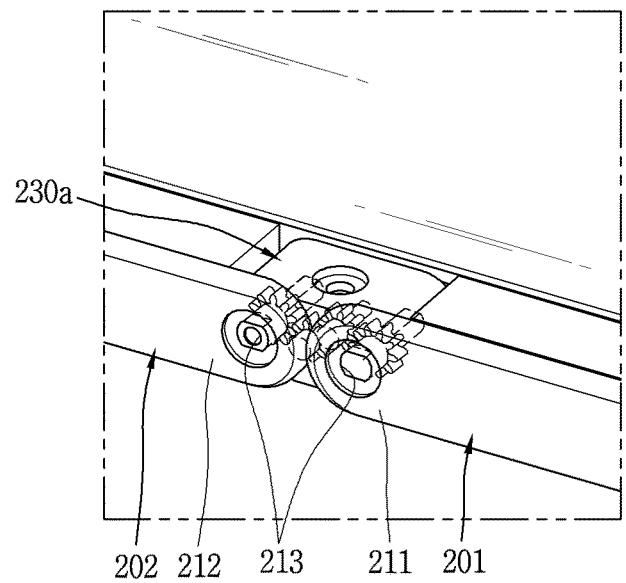
FIGS. 6 and 7 are an enlarged view and an exploded view, respectively, showing the upper hinge portion in FIG. 5.
Figure 7:
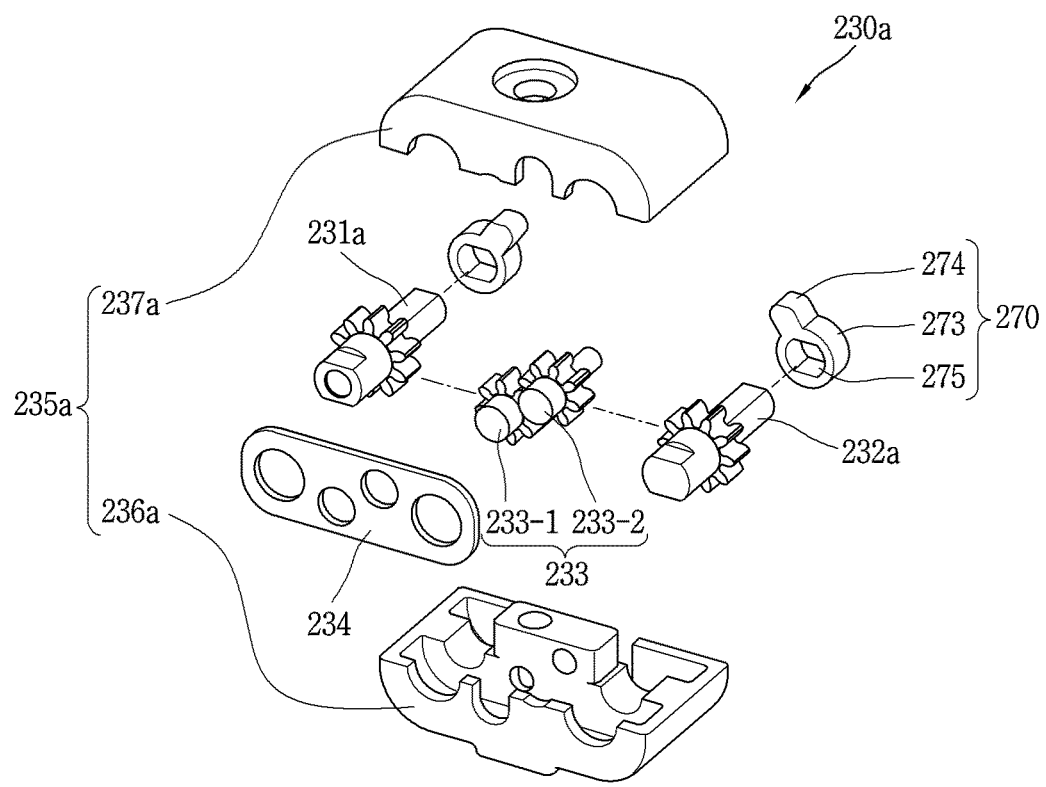
Figure 8:
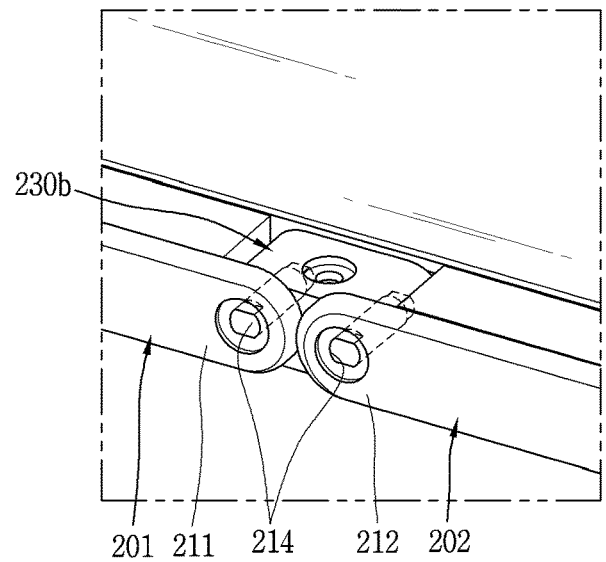
FIGS. 8 and 9 are an enlarged view and an exploded view, respectively, showing the lower hinge portion in FIG. 5.
Figure 9:
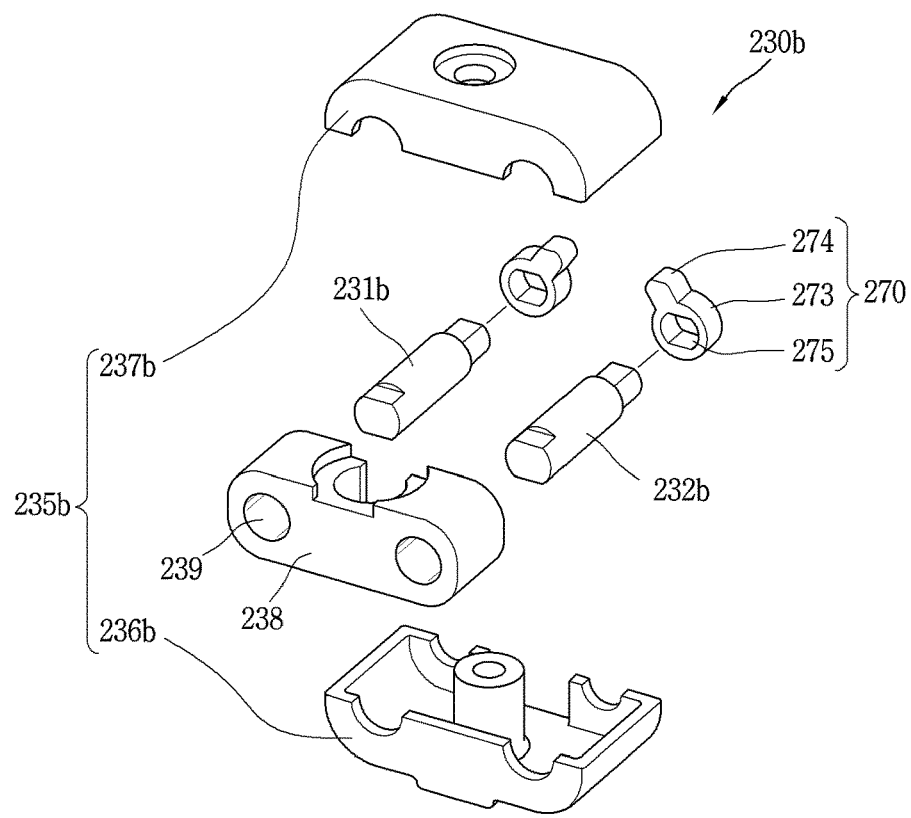

In more detail, FIG. 5 is a conceptual view showing a basic structure of upper and lower hinge portions according to another embodiment of the present disclosure, FIGS. 6 and 7 are an enlarged view and an exploded view, respectively, showing the upper hinge portion in FIG. 5, and FIGS. 8 and 9 are an enlarged view and an exploded view, respectively, showing the lower hinge portion in FIG. 5.

Referring to FIG. 5, the hinge portions 230 may be disposed on both sides of the flexible display unit 251. For such an example, the hinge portion 230 may include a first hinge 230*a* and a second hinge 230*b* disposed at both ends of the cover member 260, respectively. At this time, the first hinge 230*a* and the second hinge 230*b* may be provided with different functions. The different functions may be axial interlocking and free stop implemented in addition to a function of connecting bodies in a relatively rotatable manner. For example, the first hinge 230*a* may be provided with an axial interlock function and the second hinge 230*b* may be provided with a free stop function.

According to the illustration, the rotation shafts 231*a*, 232*a* of the first hinge 230*a* may be gear-engaged to axially interlock the first body 201 and the second body 202. More specifically, referring to FIGS. 6 and 7, the first hinge 230*a* may include a hinge housing 235*a*, a first rotation shaft 231*a*, a second rotation shaft 232*a*, and an intermediate gear 233.

The hinge housing 235*a* may include a base portion 236*a* and a cover portion 237*a*, and the first rotation shaft 231*a*, the second rotation shaft 232*a* and the intermediate gear 233 may be disposed in an inner space defined by coupling between the base portion 236*a* and the cover portion 237*a*.

The first rotation shaft 231*a* and the second rotation shaft 232*a*, which are respectively the rotation shafts of the first hinge 230*a*, may be coupled to the housings 211, 212 of the first body 201 and the second body 202. For this purpose, a hinge groove 213 (or an upper hinge groove) is formed in the housings 211, 212 of the first body 201 and the second body 202, and the rotation shafts 231*a*, 232*a* may be inserted into the hinge groove 213.

According to the illustration, gears may be formed along outer circumferences of the first rotation shaft 231*a* and the second rotation shaft 232*a*, respectively, and gear-engaged with each other by a pair of intermediate gears 233 provided on the first hinge 230*a*. More specifically, the intermediate gear 233 may include a first intermediate gear 233-1 and a second intermediate gear 233-2, and are sequentially connected in the order of the gear of the first rotation shaft 231*a*, the first intermediate gear 233-1, the second intermediate gear 233-2, and the gear of the second rotation shaft 232*a*.

According to this structure, the first hinge 230a may perform a function of axial interlocking.

Furthermore, in this instance, the foregoing lever 270 may be coupled to the first rotating shaft 231a and the second rotating shaft 232a, respectively. The coupling portion 273 of the lever 270 may be formed with a coupling groove 275 into which the first rotation shaft 231a and the second rotation shaft 232a are inserted, and the support protrusion 274 may be protruded from the coupling portion 273.

Furthermore, in order to fix the position of the gears, a gear plate 234 into which the first rotation shaft 231a, the first intermediate gear 233-1, the second intermediate gear 233-2 and the second rotation shaft 232a are inserted in a penetrating manner may be provided. In addition, support grooves supported by the end portions of the first rotation shaft 231a, the first intermediate gear 233-1, the second intermediate gear 233-2 and the second rotation shaft 232a may be formed on the housings 211, 212.

According to this structure, a structure of axial interlocking through gear engagement and a shutter structure using a lever connected to the rotation shaft may be implemented together in the first hinge 230a.

Further, referring to FIGS. 5, 8, and 9, the second hinge 230b may be provided with a free stop function. According to the illustration, a frictional force may be applied to the rotation shafts of the second hinge 230b to fix the first and second bodies 201, 202 at an arbitrary angle when the first body 201 and the second body 202 rotate relative to each other. More specifically, the second hinge 230b may include a hinge housing 235b, a first rotation shaft 231b, a second rotation shaft 232b, and a friction member 238.

The hinge housing 235b may include a base portion 236b and a cover portion 237b, and the first rotation shaft 231b, the second rotation shaft 232b and the friction member 238 may be disposed in an inner space defined by coupling between the base portion 236b and the cover portion 237b.

The first rotation shaft 231b and the second rotation shaft 232b, which are respectively the rotation shafts of the second hinge 230b, may be coupled to the housings 211, 212 of the first body 201 and the second body 202. For this purpose, a hinge groove 214 (or a lower hinge groove) is formed in the housings 211, 212 of the first body 201 and the second body 202, and the rotation shafts 231b, 232b may be inserted into the hinge groove 214. In the above-described example, when the hinge groove of the housing coupled to the first hinge 230a is an upper hinge groove, in this example, the hinge groove of the housing coupled with the second hinge 230b may be referred to as a lower hinge groove.

According to the illustration, the second hinge 230b may include the friction member 238 that generates a frictional force to the rotation shafts 231b, 232b of the second hinge 230b. The friction member 238 has a through hole 239 through which the first rotation shaft 231b and the second rotation shaft 232b are inserted, and an inner surface of the through hole 239 is brought into contact with to an outer circumferential surface of the first rotation shaft 231b, and the second rotation shaft 232b to generate the frictional force. The through hole 239 is formed in the body of the friction member 238, and the body of the friction member 238 may be made of polyacetal (POM) resin to generate an appropriate frictional force.

Furthermore, in this instance, the foregoing lever 270 may be coupled to the first rotation shaft 231b and the second rotation shaft 232b, respectively. The coupling portion 273 of the lever 270 may be formed with a coupling groove 275 into which the first and second rotation shafts 231b, 232b are inserted, and the support protrusion 274 may be protruded from an outer circumferential surface of the coupling portion 273.

As described above, a structure for free stop and a shutter structure using a lever connected to a rotation shaft may be implemented together. Meanwhile, as described above, the first hinge and the second hinge are respectively coupled to the lever to perform a shutter function. Hereinafter, a structure associated therewith will be described in more detail.

Figure 10A:
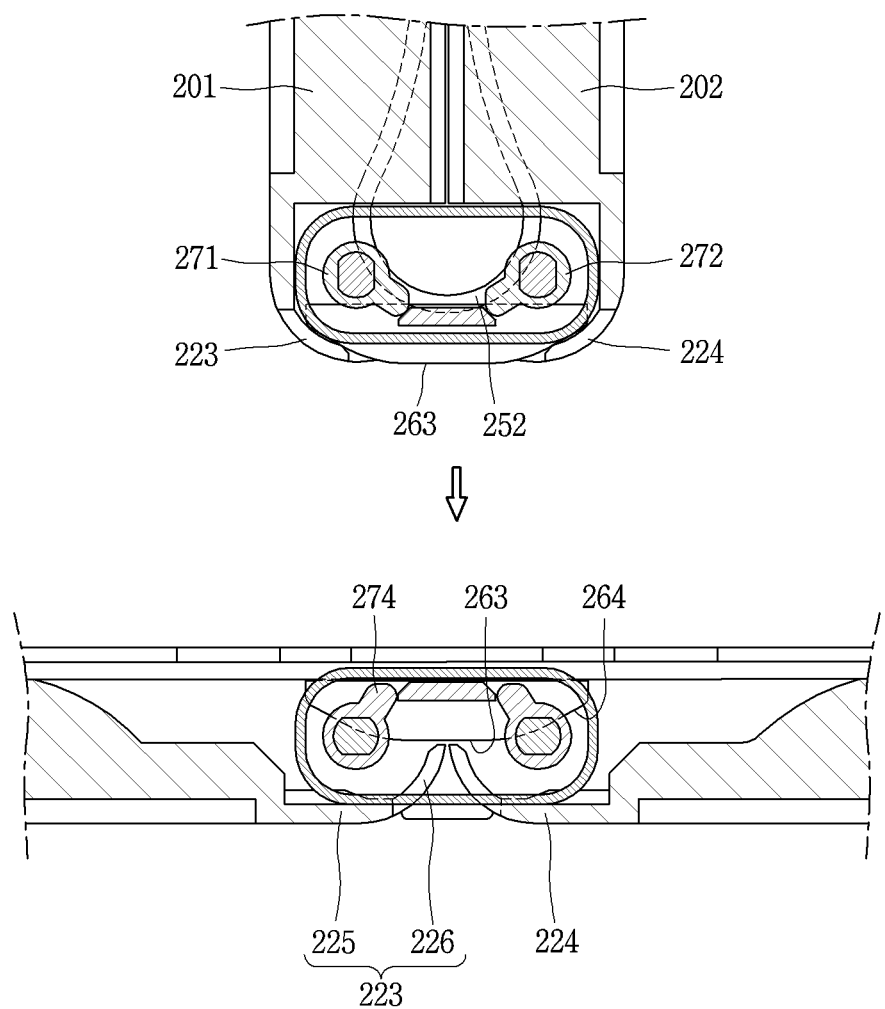
FIGS. 10A and 10B are operation diagrams showing an operation of a flexible display device according to the present disclosure.
Figure 10B:
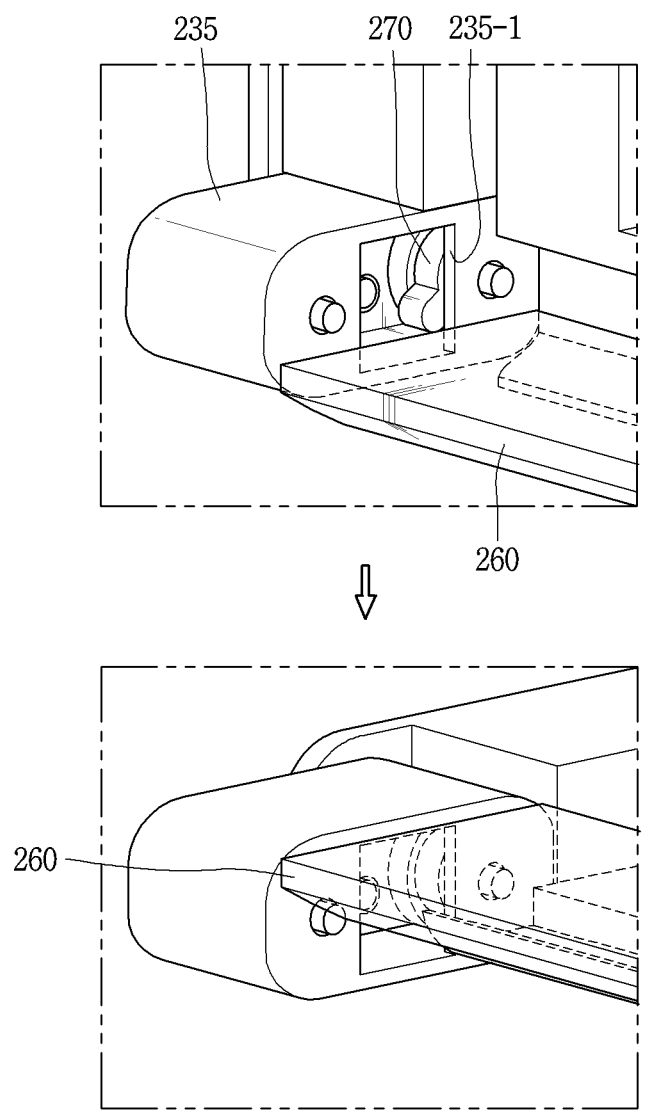
Figure 11:
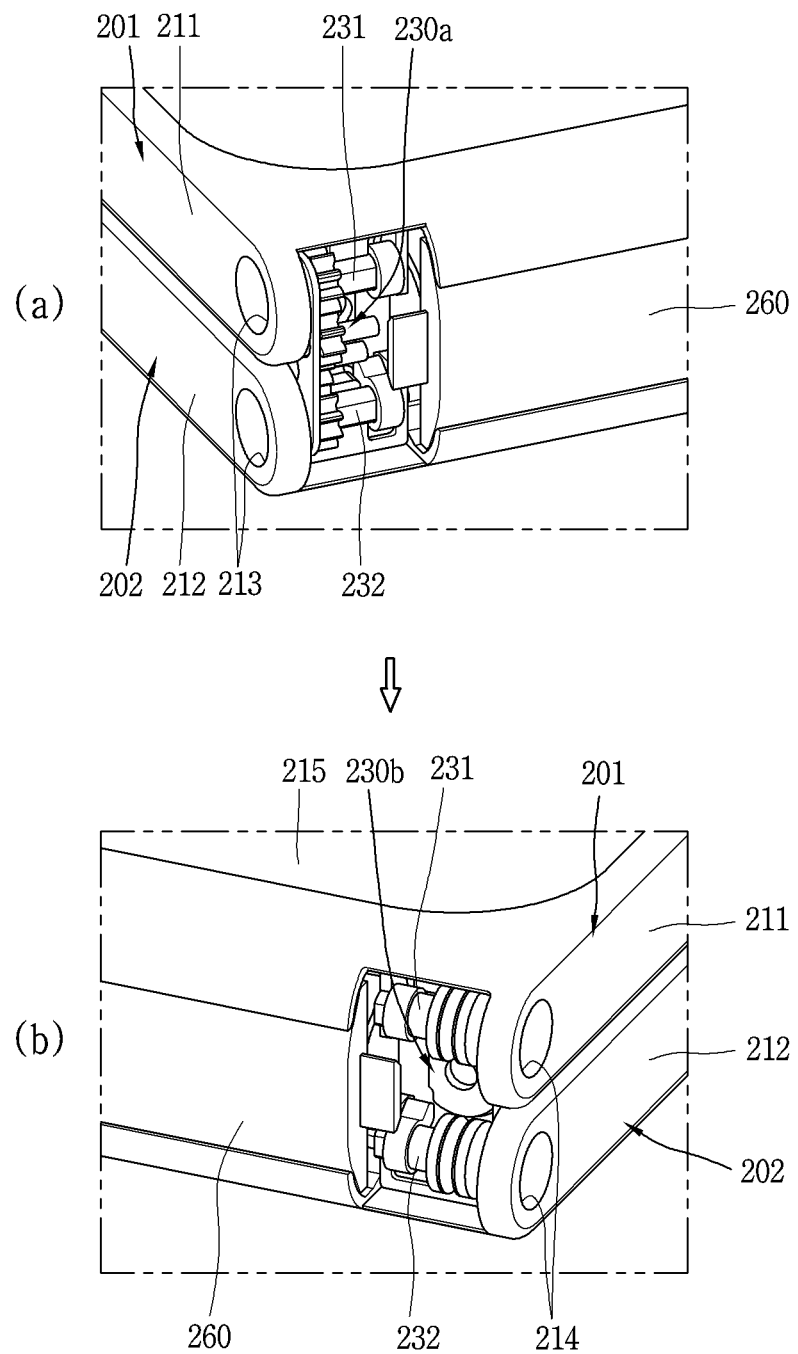
FIG. 11 is a partially enlarged view showing hinge portions in a display device to which the shutter structure of FIG. 4 and the upper and lower hinge portions of FIG. 5 are applied together.
Figure 12:
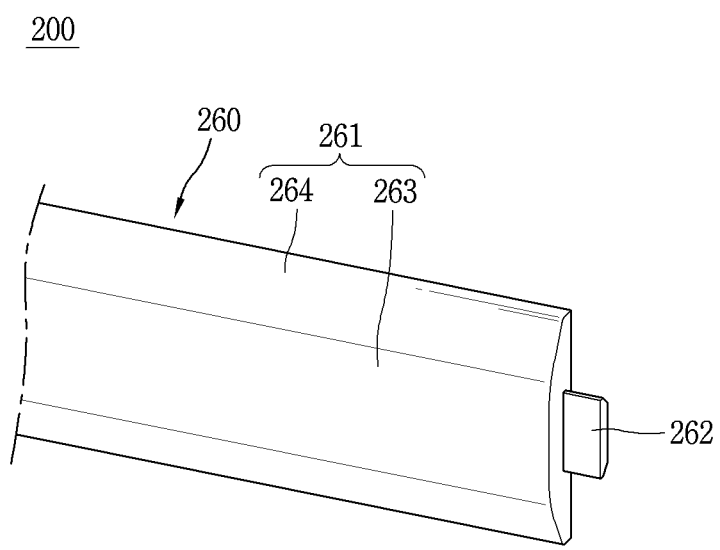
FIG. 12 is a partially enlarged view of a cover member in FIG. 11.

FIGS. 10A and 10B are operation diagrams showing an operation of a flexible display device according to the present disclosure, and FIG. 11 is a partially enlarged view showing hinge portions in a display device to which the shutter structure of FIG. 4 and the upper and lower hinge portions of FIG. 5 are applied together, and FIG. 12 is an partially enlarged view of the cover member 260 in FIG. 11.

Referring to the present drawings, as illustrated above with reference to FIG. 4, the cover member 260 may be disposed between the first body 201 and the second body 202 to cover a space between the first body 201 and the second body 202, which are formed by the folding of the flexible display unit 251.

In this instance, one side of the cover member 260 may be supported by at least one of the housings 211, 212 of the first body 201 and the second body 202 to move between the first state and the second state, and the other side thereof may be supported by the lever 270. In this example, the one side may be an outside of the cover member 260, and the other side may be an inside of the cover member 260.

As shown in an example described with reference to FIGS. 7 and 9, it may be a structure in which the lever 270 is coupled to the first rotation shaft 231 and the second rotation shaft 232 of the hinge portion 230 to press the cover member 260 in conjunction with the rotation of the bodies 201, 202. The first rotation shaft 231 and the second rotation shaft 232, which are respectively the rotation shafts of the first hinge or the second hinge, may be coupled to the housings 211, 212 of the first body 201 and the second body 202. For this purpose, hinge grooves 213, 214 may be formed in the housings 211 and 212 of the first body 201 and the second body 202, and the rotation shafts may be inserted into the hinge grooves 213, 214.

Through, the cover member 260 is disposed adjacent to the flexible display unit 251 in the first state and then pressed by the lever 270 to slidably move so as to cover a space between the first body 201 and the second body 201 in the second state. At this time, in order to support one side of the cover member 260, protruding portions 223, 224 may be protruded from the housings 211, 222 to press one side of the cover member 260 in the first state have.

The shapes of the protruding portions 223, 224 may be protruded toward each other from the first body 201 and the second body 202, and thus formed symmetrically on left and right sides with respect to the center of the cover member 260.

Referring to the present drawings, the protruding portion 223 of the first body and the protruding portion 224 of the second body may each include a first portion 225 and a second portion 226. The first portion 225 may be protruded from end portions of the first body 201 and the second body 202, and the second portion 226 may be extended from the first body 225 in a direction inclined with respect to the first body 201. The second portion 226 may be extended in a direction perpendicular to the first portion 225. At this time, at least part of the second portion 226 is formed as a curved surface to press one side of the cover member 260 in the first state, and cover at least part of the cover member 260 in the second state.

Since both sides of the cover member 260 is covered in the second state, a space between the first body 201 and the second body 202 may be completely covered by the protruding portions 223, 224 and the cover member 260 in the second state. According to this structure, a concealing operation of the cover in the opening and closing operation of the flexible display device may be implemented. In addition, according to this structure, as an outer surface of the hinge or the housing can be concealed inside, the shape of a folded portion, which has been previously expressed by angles, may be implemented in a shape close to a curved surface.

Meanwhile, in the first state, the protruding portion 223 of the first body and the protruding portion 224 of the second body may be formed to meet with each other at the respective second portions 226.

As illustrated in FIG. 10, according to this structure, the protruding portions 223, 224 cover a space between the bodies 201, 202 in the first state. Furthermore, in the first state, the protruding portions 223, 224 may press one side of the cover member 260, and such a pressing force may be transmitted to a rear surface of the flexible display unit 251 through the cover member 260. The pressing force may perform a function of unfolding the bent portion 252 of the flexible display unit 251 to be flat. In other words, the rear surface of the flexible display unit 251 is pressed in the unfolded state to maintain the flatness. However, when the flexible frame 220 is disposed on the rear surface of the flexible display unit 251, the cover member 260 may support the flexible frame 220 in the first state to transmit the pressing force to the bent portion 252 through the protruding portions 223, 223, the cover member 260, and the flexible frame 220.

Furthermore, referring to FIG. 10B, a sliding movement of the cover member 260 may be guided by the hinge housing 235 of the hinge 230. For example, an insertion hole 235-1 through which at least part of the cover member 260 is inserted may be formed on one side of the hinge housing 235. More specifically, the hinge housing of the hinge portion may include a base portion and a cover portion, and the insertion hole 235-1 may be formed in at least one of the base portion and the cover portion. The lever may be accommodated in the hinge housing to support at least part of the cover member 260 inserted into the insertion hole 235-1, and a movement range of the cover member 260 may be restricted by upper and lower ends of the insertion hole 235-1.

More specifically, as shown in FIG. 12, the cover member 260 may include a cover body 261 disposed between the first body and the second body, and an insertion protrusion 262 protruded from an end portion of the cover body 261 and inserted into the insertion hole 235-1. The cover body 261 is supported by at least one of the housings of the first body and the second body. The cover body 261 may include a flat portion 263 pressed by the foregoing protruding portions 223, 224 in the first state and an extension portion 264 extended from both sides of the flat portion 263 and configured with an inclined or curved surface. The extension portion 264 may be a portion covered by the foregoing protruding portions 223, 224 in the second state.

The insertion protrusion 262 may be formed such that both side surfaces thereof are inclined. At least part of the support protrusion 274 of the lever 270 may be overlapped on the inclined side surface in a thickness direction of the cover member 260, thereby implementing a structure in which the support protrusion 274 of the lever 270 is engaged.

Furthermore, the insertion protrusion 262 may be protruded from the flat portion 263 and inserted into the insertion hole 235-1. For such an example, the insertion protrusions 262 may be formed at both ends of the flat portion 263 and inserted into the foregoing first and second hinges 230a, 230b, respectively. Through this, the insertion protrusion 262 may be supported by the lever 271 coupled to the first hinge 230a and the lever 272 coupled to the second hinge 230b.

As described above, according to the present disclosure, a shutter structure using a hinge housing may be applied, thereby improving a freedom degree of design of the region where the hinge is located. In addition, it is possible to minimize a gap formed between the hinge portion 130 and the body.

The configurations and methods according to the above-described embodiments will not be applicable in a limited way to the foregoing flexible display device, and all or part of each embodiment may be selectively combined and configured to make various modifications thereto.

What is claimed is:

1. A flexible display device, comprising:
   a first body and a second body;
   a hinge portion connecting the first body and the second body in a relatively rotatable manner;
   a flexible display unit disposed on one side of the first body and the second body to be folded and unfolded by the relative rotation;
   a cover member disposed between the first body and the second body; and
   a lever connected to the hinge portion to rotate in conjunction with the folding and unfolding of the flexible display unit and configured to engage the cover member to move the cover member outwards to cover a space between the first body and the second body formed by folding the flexible display unit.

2. The flexible display device of claim 1, wherein the lever engages with the cover member to move the cover member inwards to be in a first state supporting the flexible display unit and move the cover member outwards to be in a second state spaced apart from the flexible display unit so as to cover the space.

3. The flexible display device of claim 2, wherein one side of the cover member is supported by housings of the first body and the second body and the other side of the cover member is supported by the lever so as to move between the first state and the second state.

4. The flexible display device of claim 2, wherein the lever includes a protrusion portion to press one side of the cover member in the first state.

5. The flexible display device of claim 4, wherein the lever further includes a coupling portion coupled to a rotation shaft of the hinge unit and configured to rotate with rotation of the rotation shaft caused by the folding and unfolding of the flexible display unit.

6. The flexible display device of claim 1, wherein the lever includes a first lever including a first protruding portion and a first coupling portion coupled to a first rotation shaft of the hinge unit that is disposed in the first body and including a second lever including a second protruding portion and a second coupling portion coupled to a second rotation shaft of the hinge unit that is disposed in the second body.

7. The flexible display device of claim 6, wherein the first and second protruding portions protrude inwards when the display unit is unfolded and protrude outwards when the display unit is folded.

8. The flexible display device of claim 6, wherein the hinge portion further comprises a hinge housing in which the first rotation shaft and the second rotation shaft are accommodated, and
wherein an insertion hole into which part of the cover member is inserted is formed on one side of the hinge housing.

9. The flexible display device of claim 8, wherein the lever is accommodated in the hinge housing to support at least part of the cover member.

10. The flexible display device of claim 8, wherein a movement range of the cover member is restricted by upper and lower ends of the insertion hole.

11. The flexible display device of claim 8, wherein the cover member comprises a cover body disposed between the first body and the second body, and an insertion protrusion protruded from an end portion of the cover body and inserted into the insertion hole.

12. The flexible display device of claim 11, wherein the cover body is supported by housings of the first body and the second body, and the insertion protrusion is supported by the lever.

13. The flexible display device of claim 1, wherein the lever comprises a first coupling portion coupled to a first rotation shaft in the first body and a second coupling portion coupled to a second rotation shaft in the second body, and a first support protrusion protruded from the first coupling portion to engage the cover body and a second support protrusion protruded from the second coupling portion to engage the cover body.

14. The flexible display device of claim 1, wherein the hinge portion comprises a first hinge and a second hinge disposed at both ends of the cover member.

15. The flexible display device of claim 14, wherein rotation shafts of the first hinge are gear-engaged to axially interlock the first body and the second body, and a frictional force is applied to rotation shafts of the second hinge to fix the first body and the second body at an arbitrary angle.

16. The flexible display device of claim 15, wherein the first hinge has an intermediate gear disposed between the rotation shafts of the first hinge, and the second hinge has a friction member that generates a frictional force to the rotation shafts of the second hinge.

17. A flexible display device, comprising:
a first body and a second body;
a flexible display unit configured to be folded and unfolded by a relative rotation between the first body and the second body;
a cover member formed to cover a space between the first body and the second body; and
a first hinge and a second hinge disposed at both ends of the cover member, respectively,
wherein rotation shafts of the first hinge are gear-engaged to axially interlock the first body and the second body, and a frictional force is applied to rotation shafts of the second hinge to fix the first body and the second body at an arbitrary angle; and
a lever supporting the cover member and coupled to the first hinge and the second hinge, respectively, to move the cover member in conjunction with the folding and unfolding of the flexible display unit.

18. The flexible display device of claim 17, wherein the first hinge and the second hinge respectively have a first rotation shaft connected to the first body and a second rotation shaft connected to the second body, and
wherein the lever is coupled to the first rotation shaft and the second rotation shaft.

19. The flexible display device of claim 17, wherein the lever engages with the cover member to move the cover member inwards to be in a first state supporting the flexible display unit and move the cover member outwards to be in a second state spaced apart from the flexible display unit so as to cover the space.

20. The flexible display device of claim 19, wherein one side of the cover member is supported by housings of the first body and the second body and the other side of the cover member is supported by the lever so as to move between the first state and the second state.

* * * * *